US006917524B2

(12) United States Patent
Pearson et al.

(10) Patent No.: US 6,917,524 B2
(45) Date of Patent: Jul. 12, 2005

(54) EXTENSION MECHANISM AND METHOD FOR ASSEMBLING OVERHANGING COMPONENTS

(75) Inventors: Tom E. Pearson, Beaverton, OR (US); George Arrigotti, Portland, OR (US); Christopher D. Combs, Portland, OR (US); Raiyomand F. Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/918,081

(22) Filed: Aug. 12, 2004

(65) Prior Publication Data

US 2005/0014419 A1 Jan. 20, 2005

Related U.S. Application Data (62) Division of application No. 09/964,747, filed on Sep. 28, 2001, now Pat. No. 6,801,436.

(51) Int. Cl.[7] .............................................. H05K 7/12
(52) U.S. Cl. ...................... 361/759; 361/732; 361/740; 361/785
(58) Field of Search ................................ 361/732, 759, 361/740, 747, 801, 741, 754, 748, 760, 784–787, 726, 803, 792; 174/254, 255

(56) References Cited

U.S. PATENT DOCUMENTS

| | | | | |
|---|---|---|---|---|
| 4,710,133 A | | 12/1987 | Lindeman | |
| 5,251,098 A | * | 10/1993 | Schmidt | 361/717 |
| 5,325,267 A | * | 6/1994 | Ewing | 361/760 |
| 5,383,095 A | * | 1/1995 | Korsunsky et al. | 361/785 |
| 5,629,839 A | * | 5/1997 | Woychik | 361/803 |
| 5,949,656 A | * | 9/1999 | Pinault | 361/788 |
| 5,963,045 A | * | 10/1999 | Zink et al. | 324/754 |
| 6,183,301 B1 | * | 2/2001 | Paagman | 439/608 |
| 6,527,588 B2 | * | 3/2003 | Paagman | 439/608 |
| 6,544,045 B1 | * | 4/2003 | Paagman | 439/79 |

FOREIGN PATENT DOCUMENTS

| | | |
|---|---|---|
| GB | 2061623 A | 5/1981 |
| JP | 64-84582 | 3/1987 |

* cited by examiner

Primary Examiner—Phuong T. Vu
Assistant Examiner—Dameon E. Levi
(74) Attorney, Agent, or Firm—Jay P. Beale

(57) ABSTRACT

A mechanism and method are provided for assembling a printed circuit board having a first surface, a second surface and an edge. The printed circuit board may include at least one female member to receive a corresponding male member. The mechanism may include an extension board having an edge to couple to the edge of the printed circuit board. The extension board may include a male member to extend from the edge of the extension board and to couple to the at least one male member so as to couple the extension board to the printed circuit board.

13 Claims, 6 Drawing Sheets

EXTENSION MECHANISM AND METHOD FOR ASSEMBLING OVERHANGING COMPONENTS

This is a divisional patent application of application Ser. No. 09/964,747, filed Sep. 28, 2001 now U.S. Pat. No. 6,801,436, titled "Extension Mechanism and Method for Assembling Overhanging Components" by Tom E. Pearson, et al., which is presently pending and is assigned to the assignee of the present invention.

FIELD

The present invention is directed to the field of printed circuit boards. More particularly, the present invention is directed to a reusable extension mechanism and method for assembling overhanging components on a printed circuit board.

BACKGROUND

For many years, electronic systems (i.e., computers, printers, etc.) have been designed with one or more printed circuit boards (PCBs) that are electrically connected together to perform various functions. One of these printed circuit boards, which is commonly employed within computers, is referred to as a "motherboard". The motherboard typically is the main printed circuit board that provides interconnections between primary electronic components of the computer such as its processor, memory, and the like.

Businesses may follow a well-established circuit board assembly procedure in order to manufacture a fully functional circuit board. This circuit board assembly procedure may have four sequential stages of which the second, third and fourth stages are performed in an assembly line environment while the first stage is performed beforehand, normally at an off-line site, in an effort to speed up the assembly line stages. The first stage may involve programming various programmable electronic components using well-known manual or automated equipment operated by one or more persons. These programmable electronic components include, but are not limited to, read-only memory ("ROM"), erasable programmable read-only memory ("EPROM") and electrically erasable and re-programmable non-volatile memory (typically referred to as "flash" memory). Afterwards, electronic components are connected to the circuit board during the second or third stages.

The second and third stages involve assembly of the circuit board by connecting surface mount technology ("SMT") components followed by through hole mount technology ("THMT") components through various widely known techniques. For example, the technique for connecting SMT components to the circuit board may include the following operations: (i) solder paste application, (ii) proper placement of the SMT components, and (iii) reflow soldering to establish connections between trace lines previously routed in the circuit board and the SMT components. Likewise, the technique for connecting the THMT components may include the following operations: (i) proper placement of THMT components, and (ii) wave soldering.

The fourth stage in manufacturing circuit boards may involve testing each component (i.e., "in circuit" testing) as well as the entire operation of the circuit board (i.e., "functional" testing) to determine whether the circuit board is functioning properly.

Assembly of the circuit board may involve overhanging components such as connectors, sockets, components and the like on leading or lagging edges of the PCBs. Overhanging surface mount technology (SMT) components are a challenge to assemble in the SMT board assembly process. Overhanging components may be devices that extend outward past the edge of a printed circuit assembly (PCA). Overhanging components may require a large "stay out" area to not interfere with SMT assembly tools such as screen print and placement machines. As such, design rules may include "stay out" zones that prohibit overhanging components on leading and/or lagging edges of PCAs. The leading and lagging edges are the non-conveying edges of the PCA. However, the SMT equipment "stay out" zone for overhanging devices may vary for different types of tools (i.e., chip shooter, component placer, screen printer) and may vary for different placement equipment vendors. The stay out zones may vary so much from different types of tools and suppliers that design rules may require that the entire leading edge of the PCA is a "stay out" zone for overhanging SMT components. More specifically, the board stops, tooling pins and sensors may be located in different areas on the equipment.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

In the following detailed description, like reference numerals and characters may be used to designate identical, corresponding or similar components in differing figure drawings. Further, in the detailed description to follow, example values may be given, although the present invention is not limited to the same. Also, well-known power/ground connections to integrated circuits (ICs) and other components may not be shown within the FIGs. for simplicity of illustration and discussion, and so as not to obscure the invention.

Figure 1:
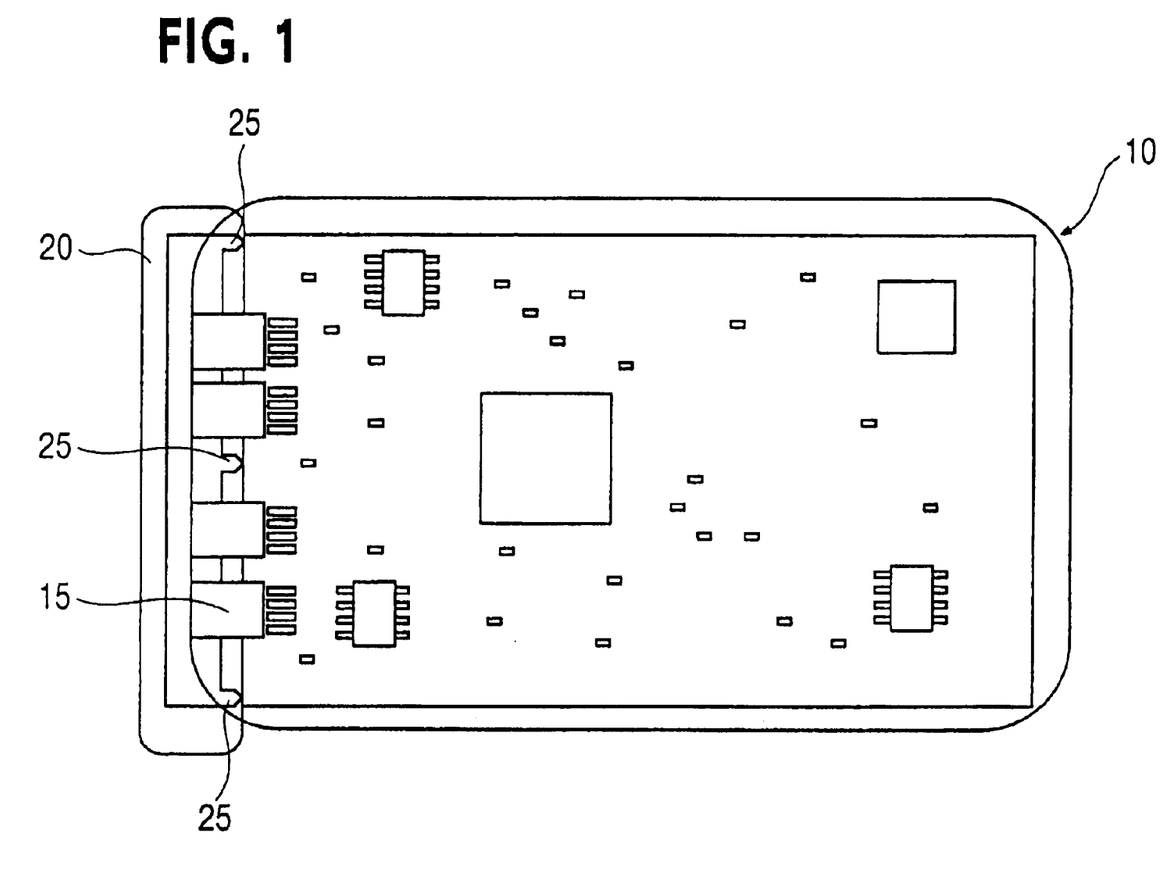
FIG. 1 illustrates a printed circuit assembly having an outrigger.

FIG. 1 illustrates a printed circuit assembly (PCA) having an outrigger. More specifically, FIG. 1 shows a printed circuit assembly 10 that includes an outrigger 20 affixed to the printed circuit assembly 10 by a plurality of extension bridges 25. The outrigger 20 is an extension of the printed circuit board (PCB) on leading or lagging edges that are attached by several small bridges (such as the extension bridges 25). The extension bridges 25 may be made out of the same material as the PCB and extend past the leading or lagging edge of the to-be-assembled PCB. The outrigger 20 may be made during the same manufacturing process as the printed circuit assembly 10 in one integral unit. Areas between the outrigger 20 and the printed circuit assembly 10 may be routed out to leave small connections such as the extension bridges 25. That is, routing or drilling the PCB area between the outrigger 20 and the PCA 10 creates the extension bridges 25. No routing or drilling is done where the extension bridges 25 are located. The extension bridges 25 may be drilled or routed so that the outrigger 20 can easily be separated from the PCA after SMT assembly. After assembly, the outrigger 20 may be broken off manually or cut-off by routers and discarded. FIG. 1 also shows how overhanging components 15 may hang over the outrigger 20. Outriggers may add a significant cost to the PCB. For example, each outrigger may add a total cost of between $0.20 and $3.50 to the cost of materials depending on the board size and the layer count. This makes overhanging SMT devices expensive to implement.

Embodiments of the present invention may utilize a printed circuit board extension (also hereafter called an extension apparatus or extension mechanism) that snaps or fits into printed circuit assemblies before SMT mounting. The extension apparatus may temporarily couple to a PCA leading edge to enable proper assembly of overhanging SMT devices such as SMT connectors. The extension apparatus may be made of the same material as the printed circuit assembly and may be specifically designed to mate to the printed circuit assembly via interlocking protrusions (or keys). Although the extension apparatus and the PCA may be made of the same material, they may be made during different manufacturing processes. Embodiments of the present invention are also applicable to the extension apparatus being made of different material than the printed circuit assembly. The protrusions may have an interference fit into the slots (or keyholes) in the PCA. This interference fit between the extension apparatus and the PCA may keep the two boards held securely together and on the same plane. As will be described, the extension apparatus is reusable with more than one PCA.

Figure 2:
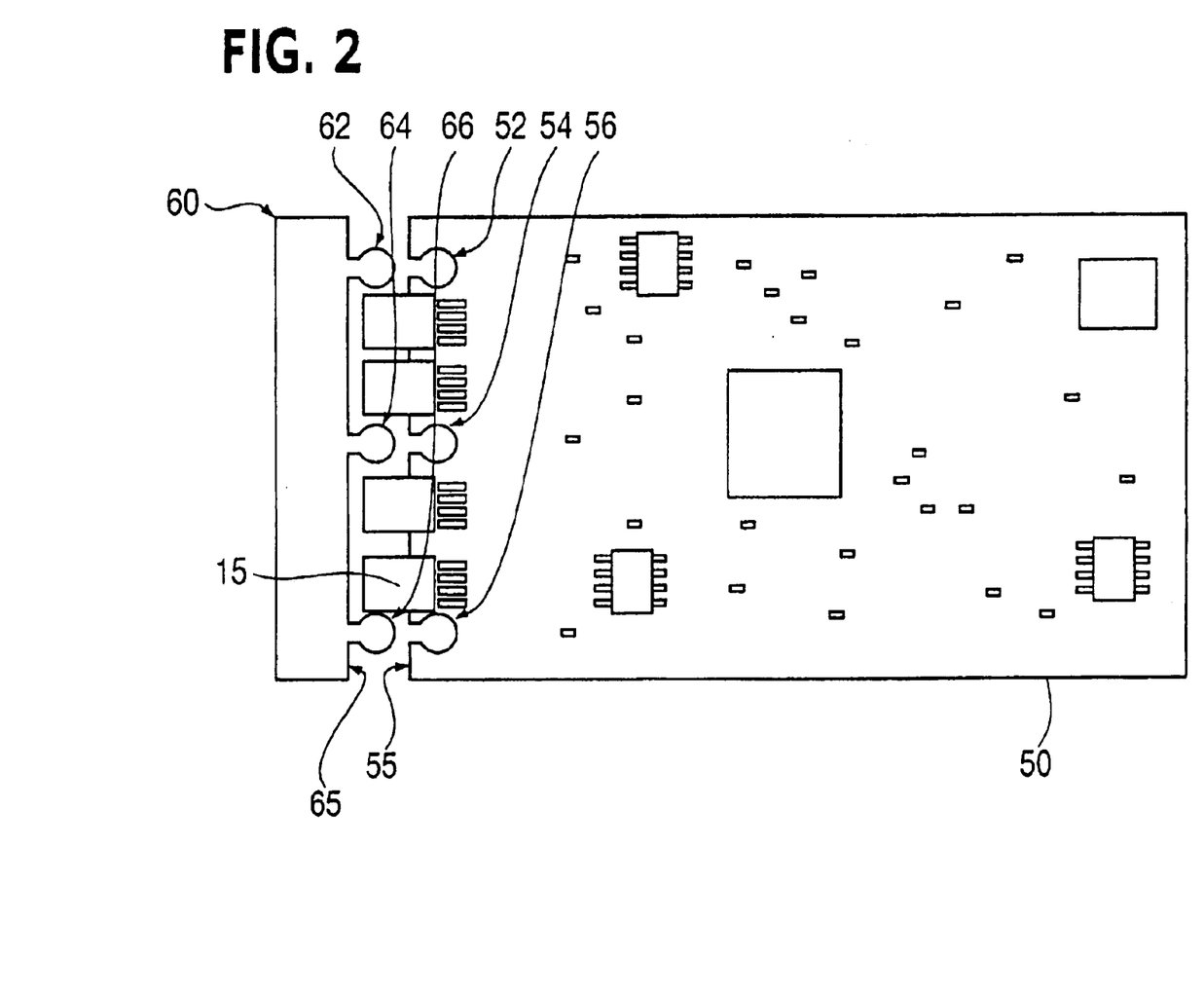
FIG. 2 illustrates a printed circuit assembly and a separate extension apparatus according to an example embodiment of the present invention.

FIG. 2 illustrates a printed circuit assembly and an extension apparatus according to an example embodiment of the present invention. Other embodiments and configurations are also within the scope of the present invention. More specifically, FIG. 2 shows a printed circuit assembly (PCA) 50 separated from an extension apparatus 60. The extension apparatus 60 may include a key 62, a key 64 and a key 66 each extending from an edge 65 of the extension apparatus 60. The printed circuit assembly 50 may include corresponding keyholes on an edge 55 to appropriately mate with respective keys. That is, the printed circuit assembly 50 includes a keyhole 52 to mate with the key 62, a keyhole 54 to mate with the key 64 and a keyhole 56 to mate with the key 66. The edge 55 of the PCA 50 represents the future edge of the board when fully assembled. The key exists on the extension apparatus 60 and provides an interlocking function to hold the extension apparatus 60 and the PCA 50 together while the PCA 50 completes the assembly process. The keyholes may be made at the manufacturer of the PCA 50 by drilling or routing (which are both common processes in PCB manufacturing). The extension apparatus 60 may be manufactured separately from the PCA 50. The extension apparatus 60 will be reusable with more than one PCA which will thereby reduce the cost of manufacturing. For illustrations purposes, FIG. 2 shows the SMT components 15 overhanging the edge of the PCA 50 after the assembly. After use on a first PCA, the PCB extension apparatus 60 may be immediately installed on another PCA just before assembly or board preparation.

Although FIG. 2 shows the keys 62, 64 and 66 provided on the extension apparatus 60 and the keyholes 52, 54 and 56 provided on the printed circuit assembly 60, embodiments of the present invention are not limited to this placement of the keys and keyholes. That is, the keys may be provided on the printed circuit assembly 50 extending from the edge 55 and the keyholes may be provided on the edge 65 of the extension apparatus 60. Furthermore, each key/keyhole may be of the same size and shape or they may be different sizes and shapes such that they match the corresponding key/keyhole on the printed circuit assembly 50 or the extension apparatus 60. Further, the extension apparatus 60 may include one (or more) key and one (or more) keyhole while the printed circuit assembly 50 may include a corresponding (or more) keyhole and a corresponding (or more) key.

Figure 3:
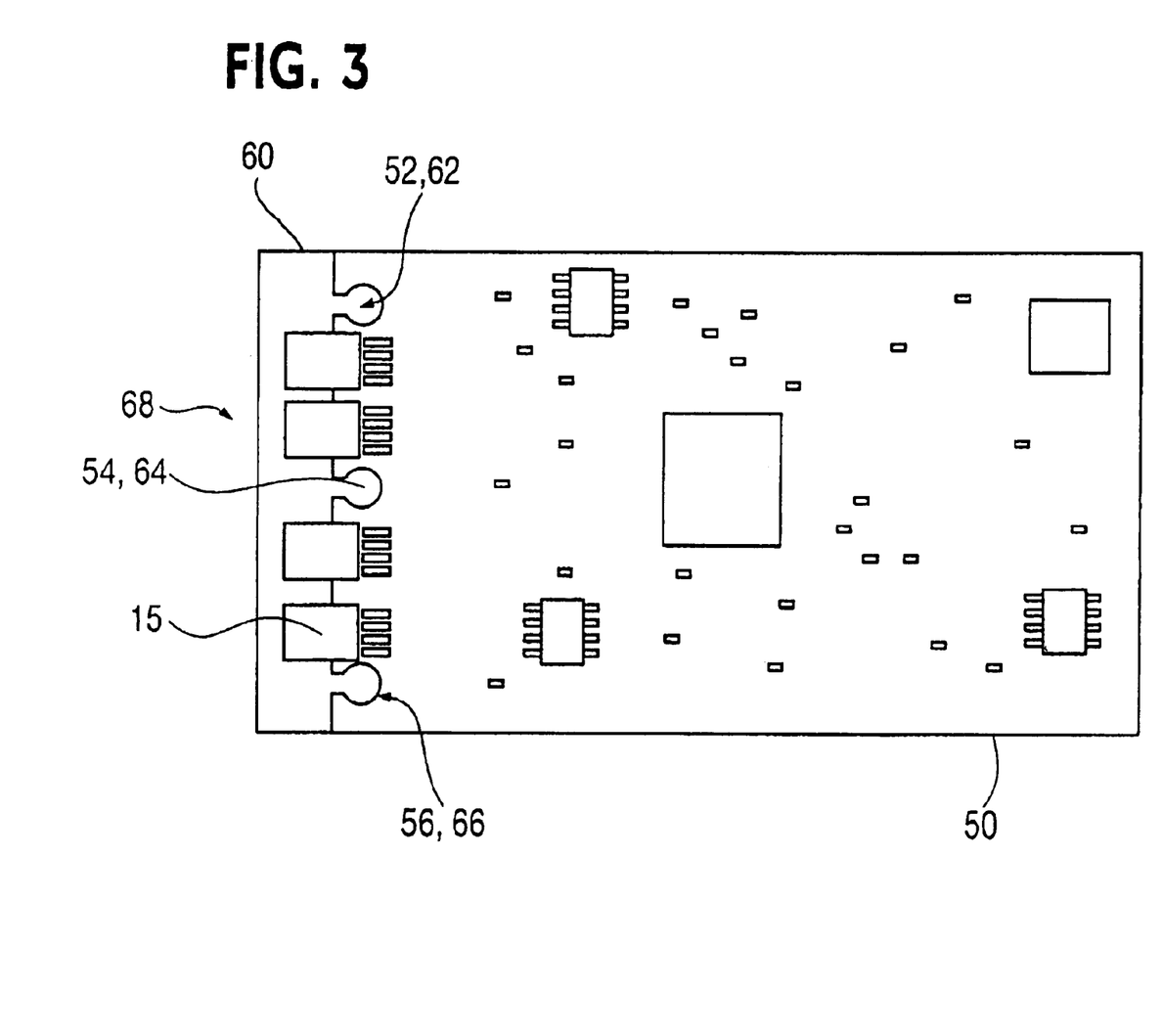
FIG. 3 illustrates the extension apparatus coupled to the printed circuit assembly according to an example embodiment of the present invention.

FIG. 3 illustrates the extension apparatus 60 coupled to the printed circuit assembly 50 according to an example embodiment of the present invention. Other embodiments and configurations are also within the scope of the present invention. That is, FIG. 3 shows the extension apparatus 60 mated to the PCA 50 and after the components have been assembled onto the PCA 50. The extension apparatus 60 provides a clean and straight edge 68 for the SMT assembly equipment to align and assemble SMT overhanging components. The extension apparatus 60 may be installed by snapping the keys 62, 64 and 66 into the keyholes 52, 54 and 56 from the bottom of the PCA 50. There is an interference fit between the extension keys and the keyholes that maintains lateral tension on the two boards. The thickness of the PCB (such as 0.062 inches) may be sufficient to keep the two boards from bending upward or downward (i.e., tilting) relative to each other.

Figure 4:
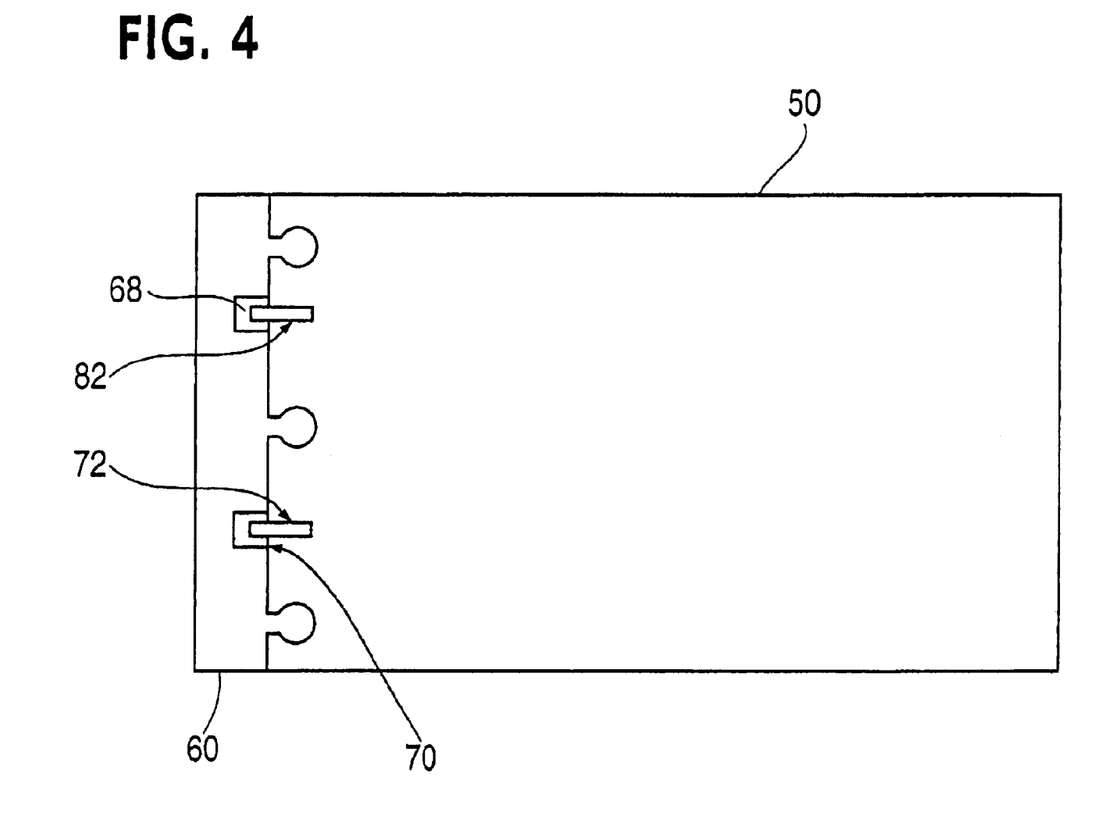
FIG. 4 illustrates a back view of the extension apparatus and the printed circuit assembly shown in FIG. 3.

FIG. 4 illustrates a back view of the extension apparatus 60 and the printed circuit assembly 50 from FIG. 3. More specifically, FIG. 4 illustrates a SMT land 70 and a SMT land 80. A guide 72 (such as a metal guide) may be affixed to the land 70 and extend from the extension apparatus 60 so as to support the bottom surface of the PCA 50. Likewise, a guide 82 may be affixed to the land 80 and extend from the extension apparatus 60 so as to support the bottom surface of the PCA 50.

Figure 5A:
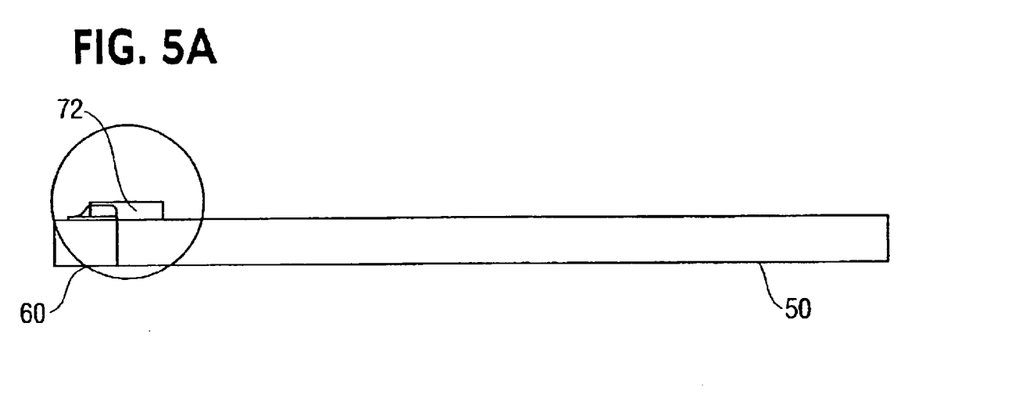
FIGS. 5A and 5B illustrate a guide according to an example embodiment of the present invention.
Figure 5B:
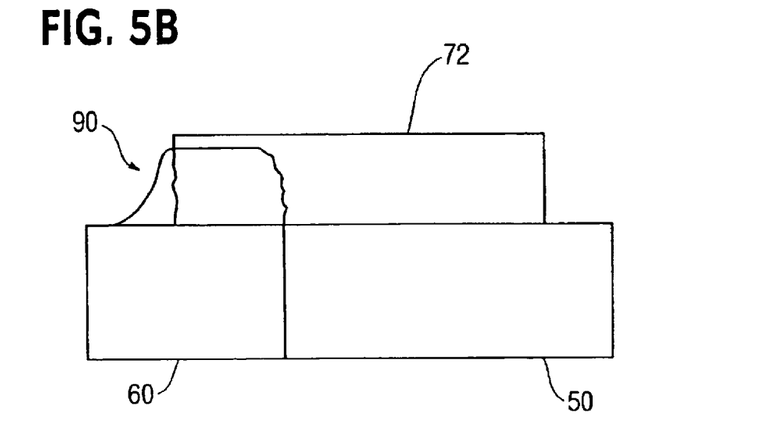

FIG. 5A is a side view of the printed circuit assembly 50 coupled to the extension apparatus 60 and the guide 72. The circular area of FIG. 5A is shown in greater detail in FIG. 5B. That is, FIG. 5B shows the guide 72 provided on the back surface of the extension apparatus 60 and extending over the back surface of the PCA 50. As shown better in FIG. 5B, the guide 72 may be coupled to the PCB extension 60 by solder 90 or other means such as strong adhesive. In this embodiment, the guide 72 is not attached to the PCA assembly 50 so as to be removable when the extension apparatus 60 is disconnected from the PCA 50. The one end of the guide 72 may be positioned underneath the PCA 50 to prevent the extension apparatus 60 and the PCA 50 from tilting upward or downward during the SMT assembly and reflow. Board supports used within the SMT manufacturing machines may be positioned underneath these boards in such a manner to eliminate (or minimize) tilting between the extension apparatus 60 and the PCA 50. The PCA 50 may then be assembled through SMT assembly with the extension apparatus 60. Subsequently, the extension apparatus 60 may be removed after the SMT process and reused on a subsequent PCA. The reuse of the extension apparatus 60 lowers the cost of manufacture/assembly as compared to the use of outriggers.

Figure 6A:
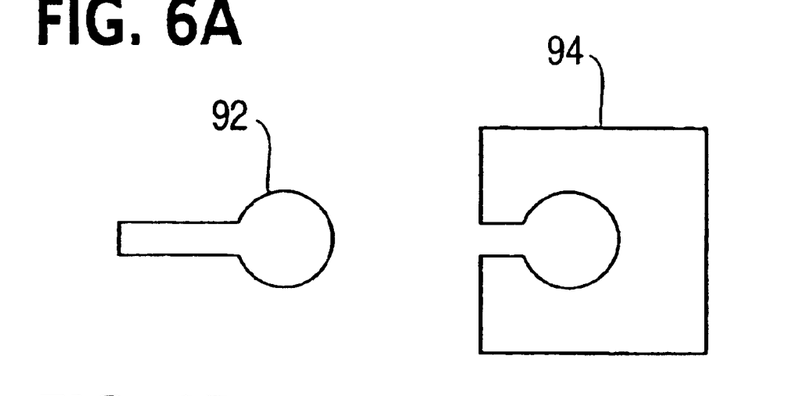
FIGS. 6A–6C illustrate keys and corresponding keyholes according to example embodiments of the present invention.
Figure 6B:
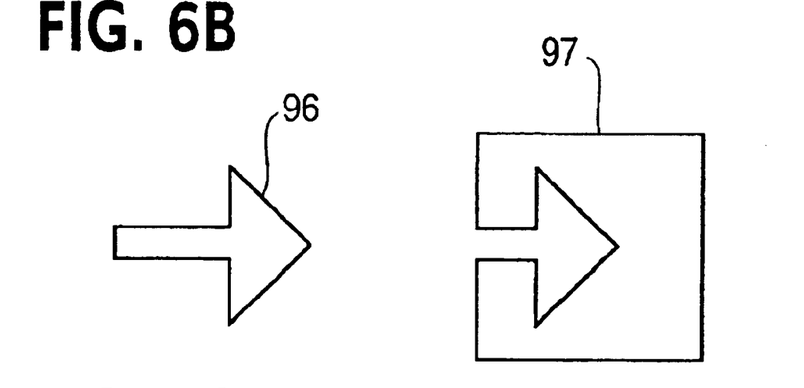
Figure 6C:
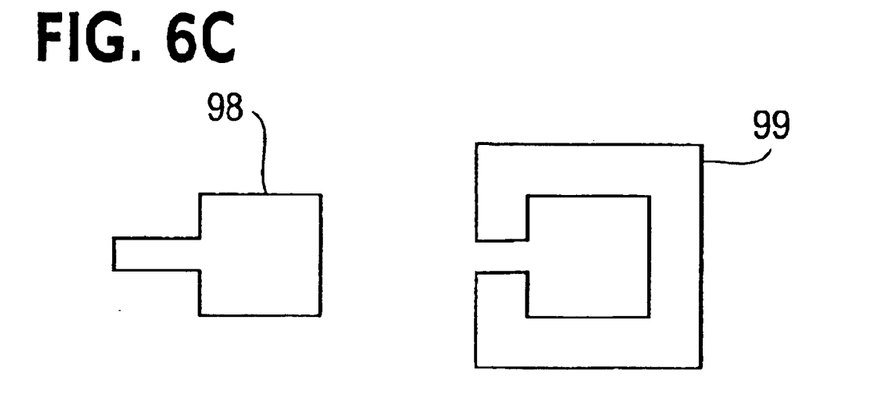

FIGS. 6A–6E show various keys and keyholes that may be provided on the extension apparatus 60 and the PCA 50. That is, FIG. 6A shows a key 92 that may be mated with a keyhole 94. FIG. 6B shows a key 96 that may be mated with a keyhole 97 and FIG. 6C shows a key 98 that may be mated with a keyhole 99. Other shapes of the key and the keyhole are also within the scope of the present invention. Furthermore, while the above description relates to the discussion of keys and keyholes, this terminology is merely exemplary. A key may correspond to a male part (or member) and a keyhole may correspond to a female part (or member). The male and female parts of the key and keyholes may be any of numerous types of shapes and sizes such that they are able to couple the extension apparatus 60 to the PCA 50. The connection between the boards is made within the thickness of PCA 50, as the key does not extend above the top surface or the bottom surface of the PCA 50. Thus, the thickness of the PCA 50 keeps the boards relatively level to each other during the assembly process. The extension apparatus may be mated by positioning keys over keyholes and snapping the boards together. This may be done by bringing the extension apparatus from the top of the PCA or by bringing the extension apparatus from the bottom of the PCA.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method of assembling a printed circuit board comprising:

reversibly attaching a handle to the printed circuit board by inserting a first member located on the handle into a second member located on the printed circuit board, wherein the first member is inserted into the second member such that the first member does not extend above a top surface of the printed circuit board and the first member does not extend below a bottom surface of the printed circuit board; and attaching components to the printed circuit board, wherein at least one attached component overhangs an edge of the printed circuit board and wherein the handle extends clear of the at least one attached component.

2. The method of claim 1, wherein the first member comprises a key and the second member comprises a keyhole.

3. The method of claim 1, wherein the handle is reversibly attached to an edge of the printed circuit board.

4. The method of claim 1, further comprising removing the first member from the second member such that the printed circuit board becomes detached from the handle.

5. The method of claim 4, wherein after removing the first member from the second member, the method further comprises attaching the handle to a second printed circuit board by inserting the first member located on the handle into a third member located on the second printed circuit board.

6. The method of claim 5, wherein the first member is inserted into the third member such that the first member does not extend above a top surface of the second printed circuit board and the first member does not extend below a bottom surface of the second printed circuit board.

7. The method of claim 6, further comprising attaching components to the second printed circuit board, wherein at least one attached component overhangs an edge of the second printed circuit board and wherein the handle extends clear of the at least one attached component.

8. The method of claim 1, further comprising manufacturing the printed circuit board and separately manufacturing the handle.

9. A method comprising:

providing a printed circuit board having at least one keyhole;

mounting a handle having at least one key to the printed circuit board by inserting the at least one key into the at least one keyhole;

mounting components on the printed circuit board such that at least one component overhangs an edge of the printed circuit board and the handle extends clear of the at least one component; and detaching the handle from the printed circuit board.

10. The method of claim 9, wherein the at least one key is inserted into the at east one keyhole such that the at least one key does not extend above a top surface of the printed circuit board and the at least one key does not extend below a bottom surface of the printed circuit board.

11. The method of claim 9, further comprising manipulating the printed circuit board with at least one piece of equipment that uses the handle to manipulate the printed circuit board.

12. The method of claim 9, further comprising mounting the handle to a second printed circuit board by inserting the at least one key into a keyhole on the second printed circuit board.

13. The method of claim 9, further comprising manufacturing the printed circuit board and separately manufacturing the handle.

* * * * *

UNITED STATES PATENT AND TRADEMARK OFFICE
CERTIFICATE OF CORRECTION

PATENT NO.   : 6,917,524 B2
DATED        : July 12, 2005
INVENTOR(S)  : Pearson et al.

It is certified that error appears in the above-identified patent and that said Letters Patent is hereby corrected as shown below:

Column 6,
Line 48, delete "east" and insert -- least --.

Signed and Sealed this

Fourth Day of October, 2005

JON W. DUDAS
*Director of the United States Patent and Trademark Office*